United States Patent [19]

Cedrone et al.

[11] Patent Number: 4,618,305

[45] Date of Patent: Oct. 21, 1986

[54] AUTOMATIC FEED APPARATUS AND PROCESS FOR INTEGRATED CIRCUITS STORED IN TUBES

[75] Inventors: Nicholas J. Cedrone, Wellesley Hills; Kenneth R. Lee, Lincoln, both of Mass.

[73] Assignee: Daymarc Corporation, Waltham, Mass.

[21] Appl. No.: 554,776

[22] Filed: Nov. 23, 1983

[51] Int. Cl.$^4$ .............................................. B65B 35/30
[52] U.S. Cl. .................................. 414/403; 198/409; 198/465.1; 414/786
[58] Field of Search ................. 414/403, 421, 425, 33, 414/125, 126, 729, 741, 740; 221/178–180, 109, 119, 121; 29/739–741, 759, 593, 837–839; 198/472, 345, 409, 341, 779, 523, 395, 464.1, 464.2, 465.1, 465.3; 294/103 R

[56] References Cited

U.S. PATENT DOCUMENTS

| 1,487,076 | 3/1924 | Pilley | 414/421 |
| 3,901,180 | 8/1975 | Allen et al. | 198/341 X |
| 4,401,234 | 8/1983 | Droira et al. | 29/741 X |

FOREIGN PATENT DOCUMENTS

| 2844169 | 4/1980 | Fed. Rep. of Germany | 29/759 |
| 0006344 | 12/1921 | Netherlands | 414/740 |
| 1263904 | 2/1972 | United Kingdom | 414/425 |

Primary Examiner—Joseph E. Valenza
Assistant Examiner—Lyle Kim
Attorney, Agent, or Firm—Kenway & Jenney

[57] ABSTRACT

An automatic system for feeding integrated circuits (IC's) stored in hollow tubes to the input of a test handler/sorter has an accumulating conveyor table that carries the tubes laterally to a pick-up position. The conveyor table is inclined from the horizontal and a stop surface at its lower edge supports and aligns a closed end of each tube. Sensor assemblies limit the lateral movement of the leading tube, assist in orienting the tube, and detect when it is located at the pick-up position and is properly oriented. The sensor assemblies generate a control signal that activates a gripping assembly organized about a plate that pivots on a rotating support frame. The gripping assembly includes centering cam inserts on one movable gripping member. One motor mounted on the frame rotates the gripping assembly and the gripped tube to the test handler/sorter input. The gripping assembly has a mechanism for controlling the discharge of IC's from the open end of the tube. A detector senses when all of the IC's are discharged to the input and generates a signal that activates another motor that rotates the frame to a position where the gripping mechanism releases the empty tube.

30 Claims, 16 Drawing Figures

AUTOMATIC FEED APPARATUS AND PROCESS FOR INTEGRATED CIRCUITS STORED IN TUBES

BACKGROUND OF THE INVENTION

This invention relates in general to apparatus and methods for feeding discrete objects to a processing machine. More specifically, it relates to a system and method that automatically feeds integrated circuits stored in hollow tubes to a test handler/sorter.

In the manufacture of dual-in-line-packaged (DIP) integrated circuits (IC's) the circuits are usually stored in an end-to-end array in a hollow plastic tube. The tube has a general U-shaped cross section to accommodate the two rows of leads extending down from both sides of the IC. The IC's slide freely in the tube and one or both ends of the tube can have stop pins inserted to hold the IC's in the tube. After their manufacture or prior to their use as a component in electronic equipment, IC's are tested and sorted based on the results of the test. Modern testing and sorting machines capable of processing IC's at a throughput rate in excess of 5,000 devices per hour are manufactured and sold by Daymarc Corporation, the assignee of this application, under its Model Nos. 1157 HL and 757. With either machine one stop pin is removed from the tube to allow the discharge of IC's from the tube to the tester/sorter. The present invention is particularly adapted for use in combination with the new Model 757 test handler/sorter where the IC's are fed to a storage unit that is inclined from the horizontal.

Production economics require that the tester/sorter operate at high rates. It is therefore necessary that the IC's be fed to the tester at a corresponding high rate, and with a high degree of reliability. One prior art feeding arrangement is the straightforward expedient of manually loading tubes onto a mechanism that feeds the IC's to a processing path (in one instance, a rotating table that carries the IC's in a spaced relationship at its periphery). Other known systems use "turrets" that carry several lines of IC's arrayed about a common axis of rotation. The IC's are manually loaded into the turret at one point from a tube and discharged at another point to a test handler/sorter. Manual systems are both slow and require an attendant to continuously feed tubes loaded with IC's to the feed mechanism. Another problem with vertical feed systems (where the tube is oriented vertically during the unloading process) is that the IC's within the tubes can assume different angular orientations with respect to the longitudinal axis of the tube. This can damage the IC's.

Various automated feed systems have been tried. Some systems designed in Japan store the tubes horizontally with one end of each tube open. One difficulty with these systems is that IC's can escape from the tube and additional care is required in handling them. Conveyors have also been used to advance tubes stacked side by side in an automated feed system. However, heretofore the conveyors have always transported the tubes while they are substantially vertical. Also, the tubes have always been open at their lower end so that the discharge could use a vertical gravity feed. Another significant limitation of prior art conveyor systems is that they require discrete fixtures to define locations on the conveyor. The tube must then be loaded into the fixtures and then removed from them. Another disadvantage is that fixtures are typically sized to accept one type of tube, whereas tubes have different standard dimensions to accommodate different standard IC's.

It is therefore a principal object of this invention to provide an automatic loading system and process for tubes of IC's of varying size that is reliable, operates at a high speed, and requires a low level of operator attention.

Another object is to provide a system with the foregoing advantages that does not require large amounts of hardware.

Yet another object is to provide a system, with the foregoing advantages that tolerates a variety or orientations of the tubes when they are initially placed in the system.

A further object is to provide a loading system with the foregoing advantages that also has an expandable tube-holding capacity.

Still another object is to provide a loading system where all of the operational components are readily accessible.

SUMMARY OF THE INVENTION

An automatic system, including both apparatus and a process carried out by the apparatus, feeds integrated circuits or the like from elongated hollow tubes to the input of a test handler/sorter. The system uses an accumulating conveyor table that is inclined from the horizontal about a lower lateral edge that extends in a first direction. The tubes are placed on the conveyor table oriented generally transversely to this first direction with their open end directed upwardly. The conveyor table carries them in the first direction to a pick-up location at one end of the conveyor table. An adjustable stop surface located at the lower edge of the table supports and aligns the closed, lower ends of the tubes.

A sensor system, preferably a pair of sensor assemblies, (i) stop the leading tube in the pick-up position, (ii) cooperate with the conveyor table to align the leading tube, (iii) detect whether the tube is properly oriented, and (iv) generate a signal if the leading tube is properly aligned and oriented. The sensor assemblies each preferably include a pivoted, gravity-biased actuator with an upstanding arm that intercepts the leading tube. A detector vane is lightly coupled to the actuator. If the tube is properly oriented, a projection on the detector vane enters a longitudinally extending cavity of the leading tube. This situation causes another portion of the detector vane to move out of a photodetector beam which generates the desired control signal.

Once the leading tube is properly positioned at the pick-up position, a gripping assembly secures it at its upper open end and transports it from the conveyor table to an input of a test handler/sorter. The gripping assembly is pivotally-mounted on a frame that rotates about an axis transverse to the axis of rotation of the gripping assembly itself. The gripping assembly, in its preferred form, includes a plate, a clamping surface secured to the plate, an opposed, movable clamping plate, and a system for driving the movable plate between an open "release" position and a closed "gripping" position. The driving system is preferably a bias spring and a counteracting solenoid mounted on the gripping plate. The clamping plate preferably carries a set of centering inserts each having mutually inclined surfaces that engage the interior walls of the leading tube that steer it to a centered position.

A motor mounted on the pivoted frame rotates the gripping assembly and the gripped tube to a position where the open end of the tube is adjacent the input of the test handler/sorter. A leaf spring with a cam surface at its free end blocks the open tube end during the rotation. A fixed cam surface mounted at the input drives the cam end of the leaf spring to a position clear of the tube. The IC's then slide out of the tube into the test handler/sorter. A detector senses when all of the IC's are discharged and generates a second control signal that activates a second motor to rotate the frame and the empty tube to a point where the gripping assembly moves to its open position to release the tube. Both motors then operate to carry the gripping assembly back to its original pick-up position to grip the following tube on the conveyor table.

These and other features and objects of the present invention will be more fully understood from the following detailed description which should be read in light of the accompanying drawings.

DETAILED DESCRIPTION OF THE PREFERRED EMBODIMENTS

Figure 1:
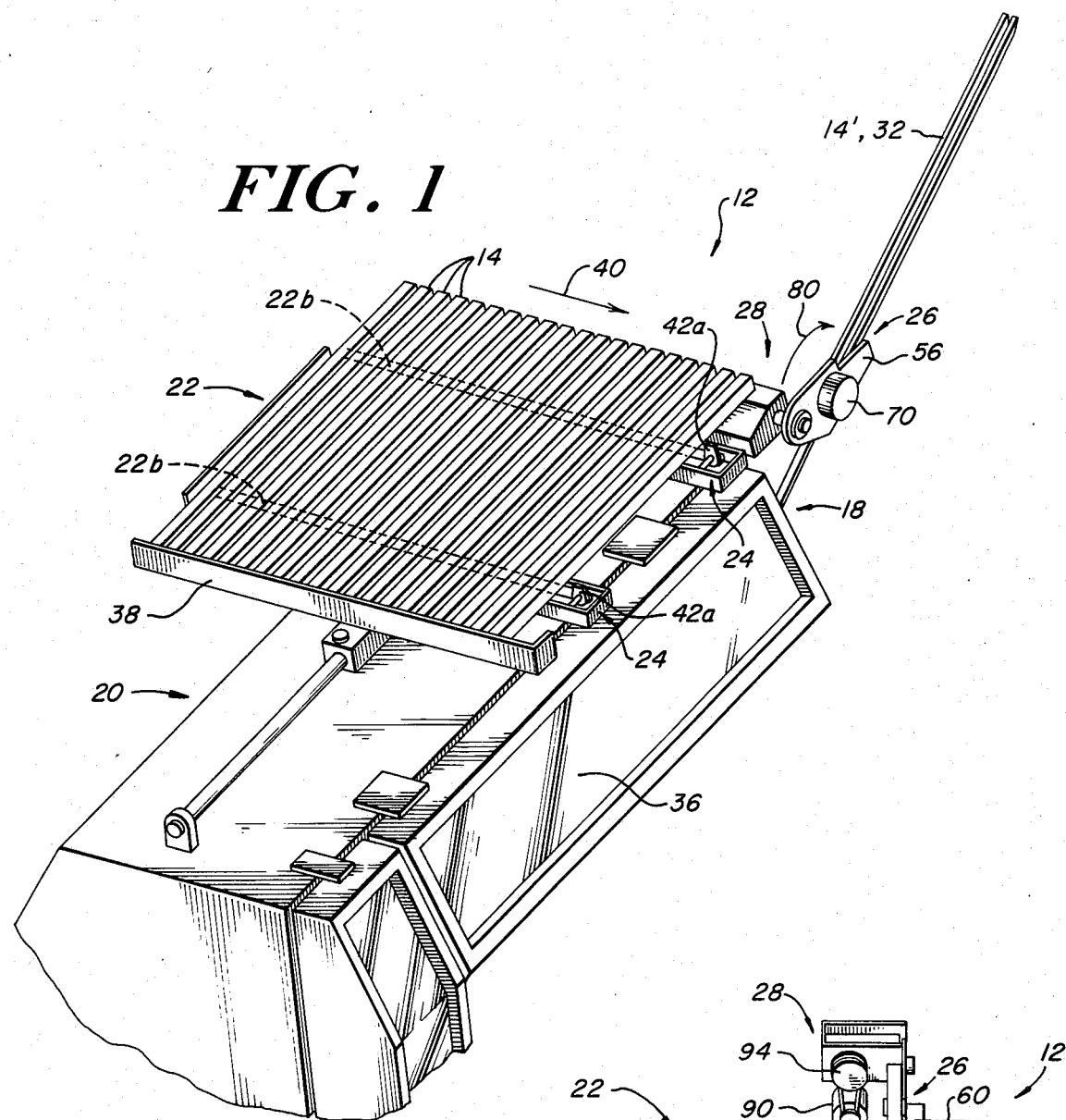
FIG. 1 is a perspective view of a feed system according to the present invention and a portion of an associated integrated circuit (IC) test handler/sorter including an enclosed storage unit that receive the IC's from tubes.

With reference to FIGS. 1–4, an automatic feed system 12 repeatedly aligns and transports tubes 14 of integrated circuits 16 to an input 18 of a test handler/sorter 20. The feed system 12 includes an accumulating conveyor table 22, sensing assemblies 24 mounted on the conveyor, a gripping mechanism 26, and a transport mechanism indicated generally at 28 that carries a gripped tube from a pick-up position 30 on the conveyor to an IC discharge position 32, and then to a tube-release position 34.

Figure 3:
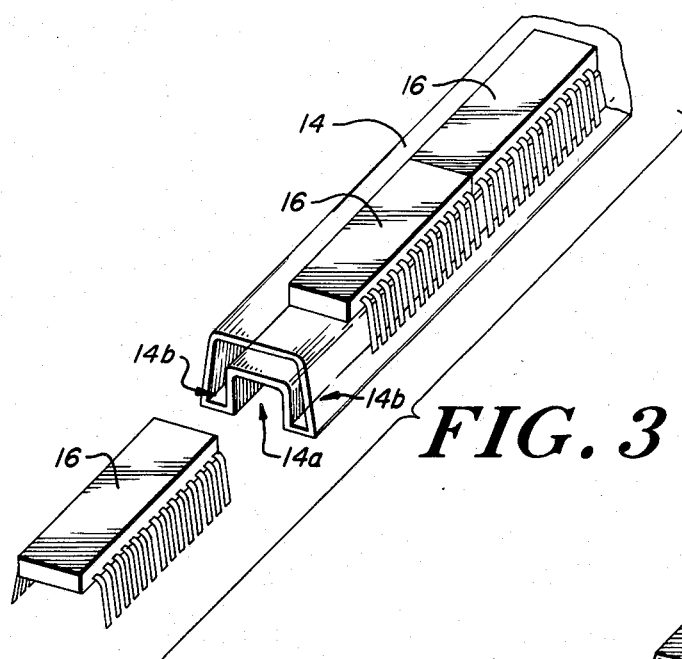
FIG. 3 is a view in perspective of a tube and one size of DIP IC stored in the tube.
Figure 4:
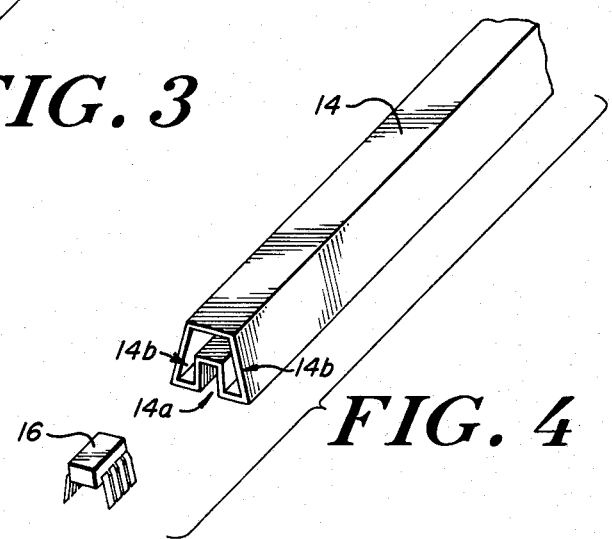
FIG. 4 is a view corresponding to FIG. 3 of a smaller size tube and an associated DIP IC suitable for storage in the tube.

Each tube 14 is an elongated hollow plastic member with a double walled, U-shaped cross section. The tube is configured to hold a line of IC's 16 with a dual-in-line-packaged (DIP) configuration in end-to-end array with the IC's freely slidable within the tube. Typically the tube is sized to accept IC's of one of several standard sizes. FIGS. 3 and 4 demonstrate several such IC's and their corresponding tubes. Also, each tube usually has a replaceable pin that blocks the movement of IC's at one or both of its ends. In connection with the operation of the feed system described herein, one end of each tube is open and one end is closed.

The feed system 12 is particularly adapted for use in combination with a Model 757 test handler/sorter 20 manufactured and sold by Daymarc Corporation. This is a high speed machine with an initial storage unit 36 that receives IC's at the input 18, stores them for an interval of time to allow them to reach a desired temperature, and then tests them. The storage unit 36 is inclined from the horizontal by an acute angle, typically approximately 20°. It is sufficiently long to accept in line the IC's held in one tube 14. (While the present invention is described with respect to the feeding and processing of DIP IC's, it is not limited to these devices. The term integrated circuit or IC should therefore be construed to include other electronic components with similar handling characteristics.)

Figure 2:
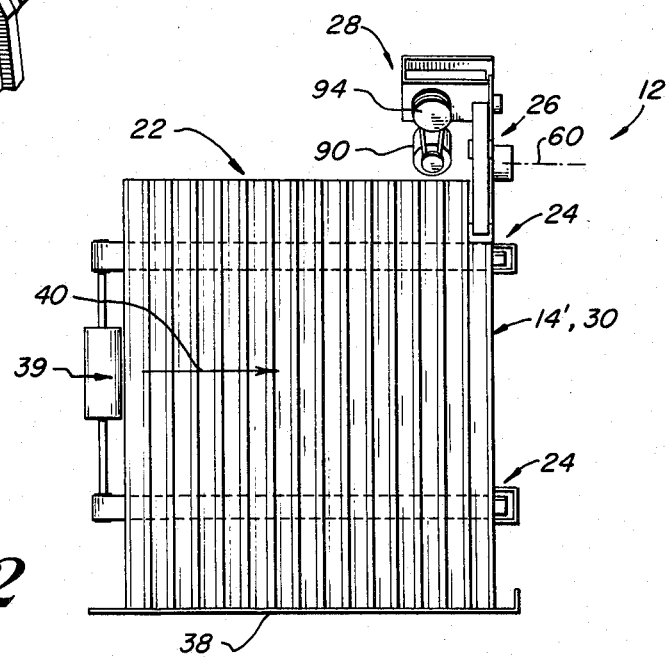
FIG. 2 is a top plan view of the feed system shown in FIG. 1.

The conveyor table 22 is generally rectangular, mounted on the top surface of the storage unit 36, and also inclined at an acute angle from the horizontal about a lower edge defined by a laterally extending stop member 38. To accommodate tubes of different lengths, the stop member is mounted to move in a direction generally perpendicular to its length. In its preferred form, the conveyor table uses two conveyor belts 22b, 22b that are spaced from one another and extend generally parallel to one another and the stop 38. The belts are formed of a material that produces a moderate degree of frictional coupling between the belts and tubes placed on the belts as shown in FIGS. 1 and 2. The belts are shown as being substantially filled with tubes 14 oriented generally perpendicular to the belts. However, this invention works equally well with only one or a few tubes, or at the other extreme, with an even larger number of tubes carried on longer belts than those illustrated. Hence the capacity of the system is expandable to meet the operating requirements of a given installation.

The belts are driven in unison by a conventional drive mechanism 39 so that their upper runs travel left to right, as shown, in the direction of arrow 40. This movement carries the leading tube 14' on the conveyor table 22 to the right until it abuts the two sensing assemblies 24,24 near its upper and lower ends. When a tube abuts both sensing assemblies, it is aligned in the pick-up position 30.

If a tube is not properly aligned when it is placed on the conveyor, both conveyors will continue to run until both assemblies 24,24 abut the leading tube. The conveyor table in combination with the sensor assemblies therefore provides an automatic alignment of tubes. As a result, an operator does not have to locate a tube in a fixture or place it on the conveyor with a preselected orientation. It is also significant that the tubes 14 are placed on the table with their closed ends supported on the stop 38 and their open ends "up." This is directly opposite to conventional feeders using conveyors.

The angle of inclination of the conveyor table 22 can range from 5° to 85°, but values in the range of 10° to 30° are usually better and a value of approximately 20° is preferred. The inclination should be sufficient to ensure that the IC's remain in their tubes and that the closed lower ends of the tubes come to rest on the stop member 38. This aligns the tubes longitudinally and allows the member 38 to guide them as they are driven in the direction 40 by the conveyor belts.

Figure 5:
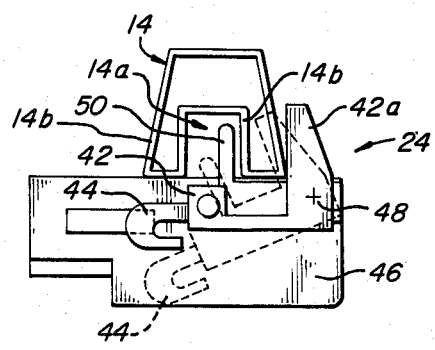
FIG. 5 is a detailed end view of a sensor assembly mounted on the conveyor table shown in FIGS. 1 and 2 to sense that a tube is in the pick-up position and is properly oriented (as shown) to be gripped and unloaded.
Figure 5A:
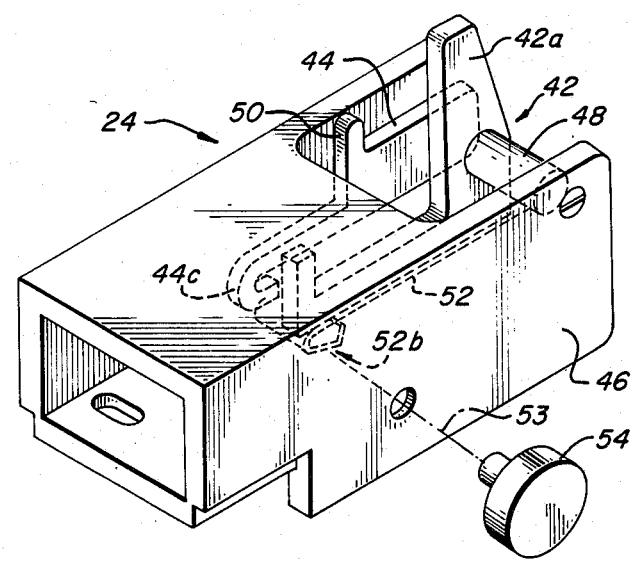
FIG. 5A is a view in perspective of the sensor assembly shown in FIG. 5 plus an associated photocell.
Figure 5B:
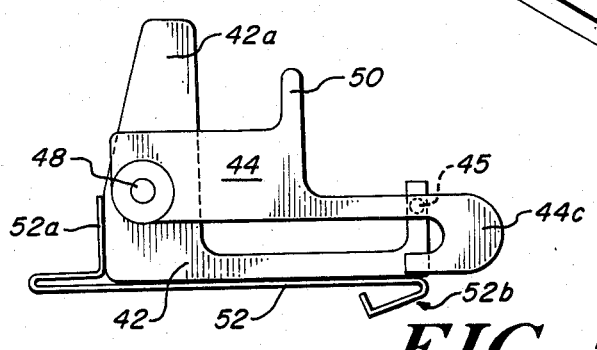
FIG. 5B is a detailed view in side elevation of the actuator and detector vanes shown in FIGS. 5 and 5A, together with a spring coupling between the vanes, but viewed from the opposite direction than in FIG. 5.
Figure 6:
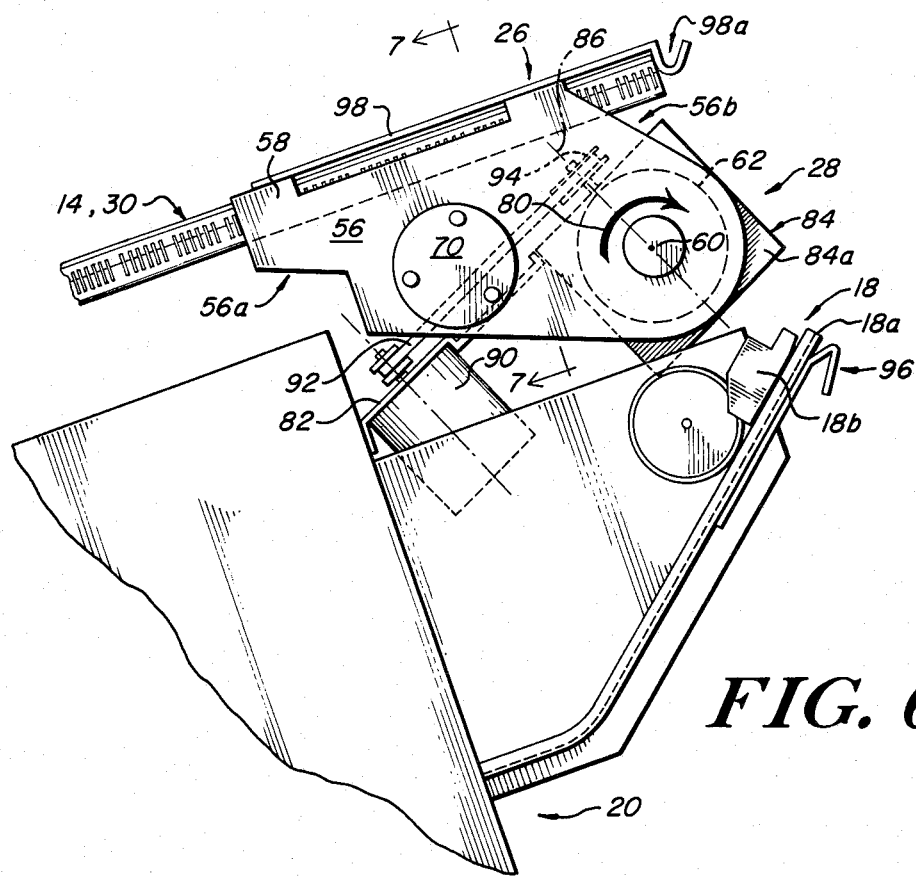
FIG. 6 is a view in side elevation with portion broken away of the feed system shown in FIGS. 1 and 2.

As is best seen in FIGS. 5, 5A and 5B, each sensing unit has two principal mechanical members, an actuator vane 42 and a detector vane 44, both pivotally mounted in a mount 46 for rotation about a pivot pin 48. The actuator vane is generally L-shaped and has an upright arm 42a that projects above the upper surface of the conveyors. When the conveyor belts 22b,22b carry the leading tube 14' against an arm 42a, the frictional coupling between the leading tube and the belts causes the tube to drive the arm from a "no-tube" position (shown in phantom in FIG. 5) to a "tube-present" position shown in solid lines. This rotation occurs against a small gravitational force that tends to rotate the vane 42 about the pin 48 to the "no-tube" position.

The detector vane 44 is lightly coupled to the actuator vane so that they move in unison unless the detector vane strikes an obstacle. The detector vane is also biased to rotate freely under the influence of gravity to a "no-tube" position (shown in phantom in FIG. 5). The vane 44 has a probe 50 that projects upwardly and is positioned to enter the central, longitudinally extending cavity 14a of the leading tube 14' (providing that the tube 14' is located in the pick-up position and is properly oriented, as shown, with its two "legs" 14b,14b on the conveyor table). If the tube is not properly positioned laterally (in the direction of the arrow 40), the probe will strike the bottom surface of one of the legs 14b. If the tube is improperly oriented, for example, if the press of following tubes causes the leading tube to rotate about its longitudinal axis, then the probe 50 will strike some other surface of the tube, not the cavity 14a, as the actuator vane rotates up to its "tube present" postion.

As is best seen in FIGS. 5A and 5B, the vane 42 carries a leaf spring 52 with an end 52a secured to the vane and an opposite end 52b located under and end 44a of the vane 44. While this spring coupling is shown, alternative arrangements can also be used, and may be preferred. One alternative arrangement uses two small permanent magnets 45 secured to the vanes 42 and 44 and having polarities such that a weak attractive magnetic force of these magnets couples the vanes so that this move in unison. If the probing movement of the vane 44 is impeded because the tube 14' is not properly aligned or oriented, then the vane 42 will continue to rotate, but the vane 44 will fall to its initial rest position. Once the vanes become "separated", the magnet pairs 45, 45 are spaced far enough from one another that they exert a negligible attractive force that is not sufficiently strong to overcome the gravitational force tending to return the vane 44 to its rest position.

If the vane 42 is driven by a tube to the "tube-present" position, and if the probe enters the central cavity 14a, then a vane portion 44c is in a position where it no longer intercepts a light beam 53 directed at a photoelectric cell 54. When the beam strikes the cell, it generates an electrical "GRIP" signal indicating that the leading tube 14' is in the pick-up position 30 and is properly oriented. When the cell 54 associated with both assemblies 24,24 this "GRIP" signal, the gripping mechanism 26 is actuated to secure the upper, open end of the tube 14'.

Figure 9:
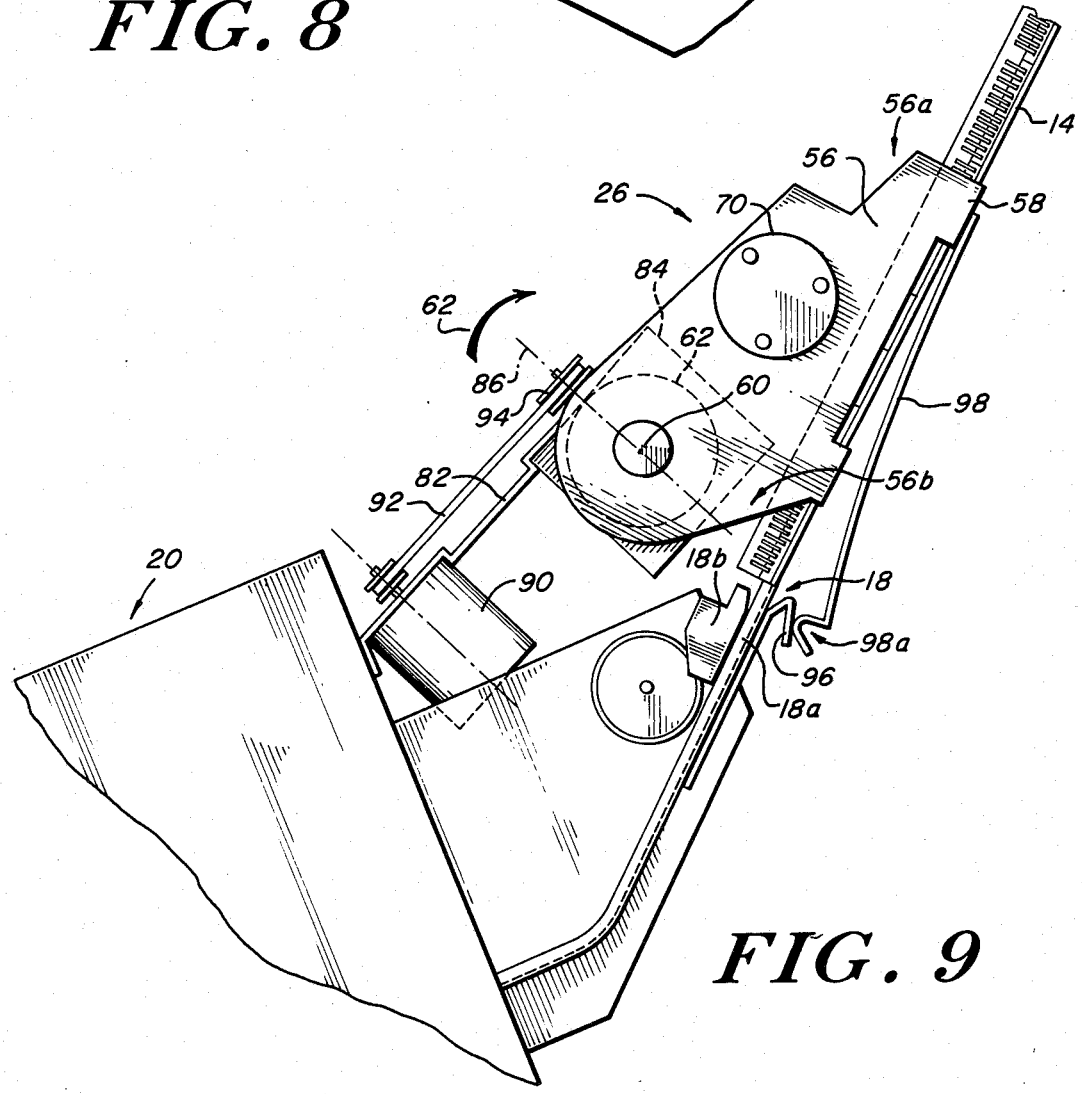
FIG. 9 is a view in side elevation corresponding to FIG. 6 but with the feed system in position to discharge IC's from a gripped tube to the input of a test handler/sorter.

The gripping mechanism 26, as best seen in FIGS. 6–9, is organized about a plate 56 that rotates about an axis 60 under the control of a synchronous A.C. motor 62. The plate has flanged portions 58,58 along its "upper" edge, a trimmed corner 56a to clear the conveyor table when it is positioned to pick up a tube 14' (FIG. 6), and a trimmed corner 56b to clear the input assembly 18 of the test handler/sorter 20 when it is in the IC feed position (FIG. 9). A gripping plate 64 is mounted within the plate 56 (FIG. 7) in a face-abutting, sliding relationship. The plate 64 has a flanged end portion 66 that is in a generally parallel, spaced relationship with the flanged portions 58,58. The plate 64 moves between a release position, shown in solid lines in FIGS. 7 and 8, and a gripping position shown in phantom.

Figure 7:
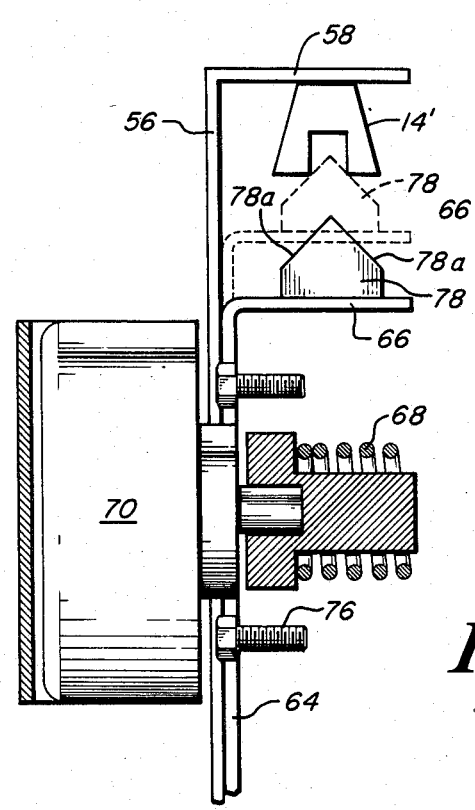
FIG. 7 is a detailed view taken along the line 7—7 in FIG. 6 showing the gripping assembly.
Figure 8:
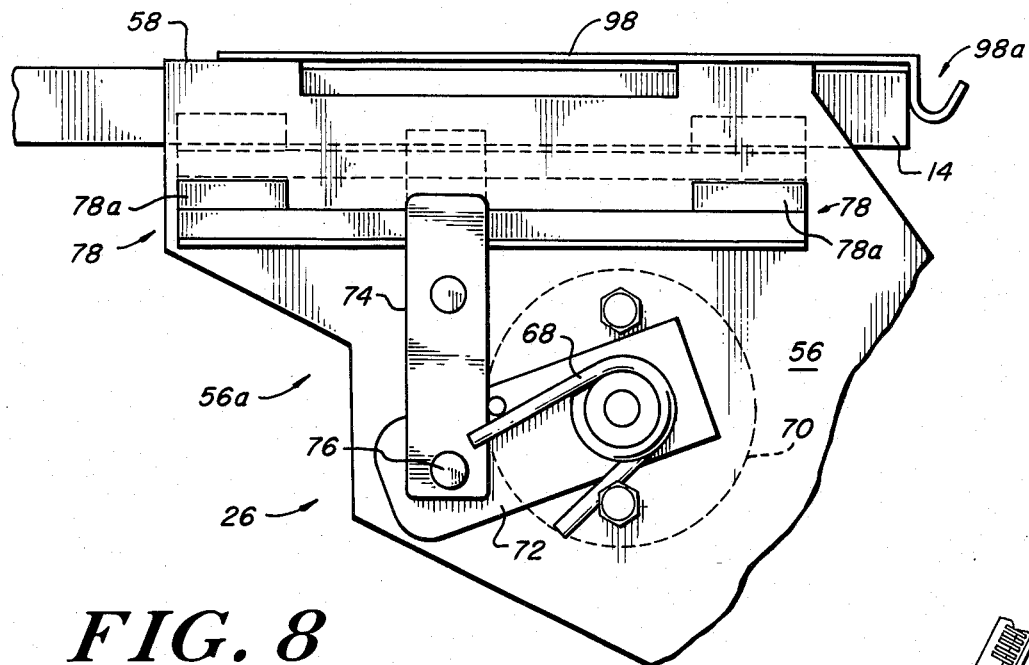
FIG. 8 is a detailed view in side elevation of the gripping assembly shown in FIG. 7 with portions broken away.

A spring 68, a solenoid 70, and a pair of actuating arms 72,74 drive the plate 64. The arm 72 rotates about one of its ends under the control of the spring and solenoid. At its opposite end it is joined at a pivot pin 76 to one end of the arm 74. As shown in FIG. 7, the pivot pin is mounted on the plate 64 and projects "inwardly." The opposite end of the arm 74 connects to and drives the plate 64. The spring 68 urges the plate 64 and its flanged portion 66 to the gripping position. When activated by the "GRIP" signal of the cells 54,54, the solenoid is deactivated and the movable gripping plate 64 moves under the influence of the spring 68. To release a tube, the solenoid is activated to rotate the arm 72 against the force of the spring 68.

A set of centering cams 78,78 are mounted on the "upper" face of the flanged portion 66. Each cam has a pair of inclined cam surfaces 78a,78a that engage the lower, inner corners of the tube legs 14b,14b adjacent its longitudinal cavity 14a. The cam surfaces 78a, 78a are preferably inclined at the same angle so that as the plate 64 moves "upwardly" to its gripping position, the cam surfaces automatically steer the tube 14' to a position where it is aligned with the cams, as shown in FIG. 7. The cams 78,78 therefore provide a "fine-tuning" of the lateral positioning of the tube 14' with respect to the gripping and transport mechanisms as well as the IC input 18. FIG. 7 also illustrates the gripping action caused by the tube 14' being clamped between the flanged portion 58 and the cams 78,78.

The transport mechanism 28 includes the gripping mechanism 26 since a principal movement in the transport of a gripped tube is its rotation about the axis 60, in the direction indicated by arrow 80, powered by the motor 62. However, the transport mechanism also includes as major components a mounting frame 82, a U-shaped mounting frame 84 that rotates between arms of the frame 82 about an axis of rotation 86 defined by a pivot pin 88, an A.C. synchronous motor 90, and a belt drive 92 that connects the motor 90 to a pulley 94 which in turn is connected to the U-shaped frame 84. The U-shaped frame 84 mounts the motor 62 on its end wall 84a. The frame 82 mounts the motor 90. The motor 90 is fixed, but the motor 92 rotates in unison with the frame 84. The motor 90 produces a rotation of the frame 84, the motor 62, and the gripping mechanism 26 in a plane perpendicular to the rotational axis 86 and generally aligned with the inclined storage unit 36. The motor 62, as noted above, rotates only the gripping mechanism with the rotation being about the axis 60 which is generally perpendicular to the axis 86.

Figure 10:
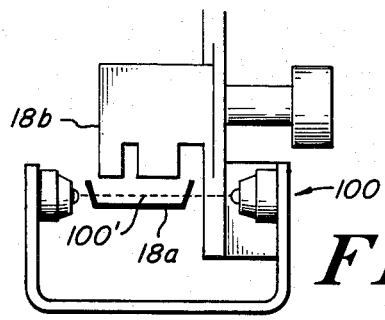
FIG. 10 is a detailed view of a photodetector assembly mounted at the discharge point to sense the presence of IC's.

In operation, once a tube 14' in the pick-up position 30 is gripped, the motor 62 rotates the gripping mechanism in the direction 80 to the IC feed or discharge position 32. This initial rotation is in a single plane that is generally perpendicular to the plane of the conveyor table 22. When the gripped tube is in the feed position 32 (FIGS. 1 and 9), a cam member 96 fixed at the input 18 engages a cam and blocking end 98a of a leaf spring 98. The spring 98 is secured at its end opposite the cam and blocking end 98a to one of the flanged portions 58. The end 98a is designed to block the open end of the tube 14' and thereby prevents the IC's from sliding out of the tube during its rotation from the position 30 to the position 32. (As shown this rotation is more than 90° and during the rotation the tube is oriented vertically with its open end at the bottom.) As the tube approaches the feed position 32, the cam 96 engages the cam end 98a. Continued rotation drives the cam end 98a against the spring force of the spring 98 until the end 98a is completely clear of the open end of the tube. As soon as the end portion 98a clears the tube, the IC's slide out of the tube into the input 18 (which includes a feed track 18a and an opposed guide member 18b as shown in FIGS. 9 and 10). The IC's unload in a substantially continuous stream. An LED/ photocell assembly 100 (FIG. 10) generates an electrical UNLOAD COMPLETE signal when the flow of IC's from the tube to the input ceases, that is, when the IC's no longer block a light beam 100' of the photocell assembly. This signal activates the motor 90 to rotate the frame 84, the attached gripping mechanism 26 and the empty tube in the direction of arrow 102 to the tube release position 34.

Figure 11:
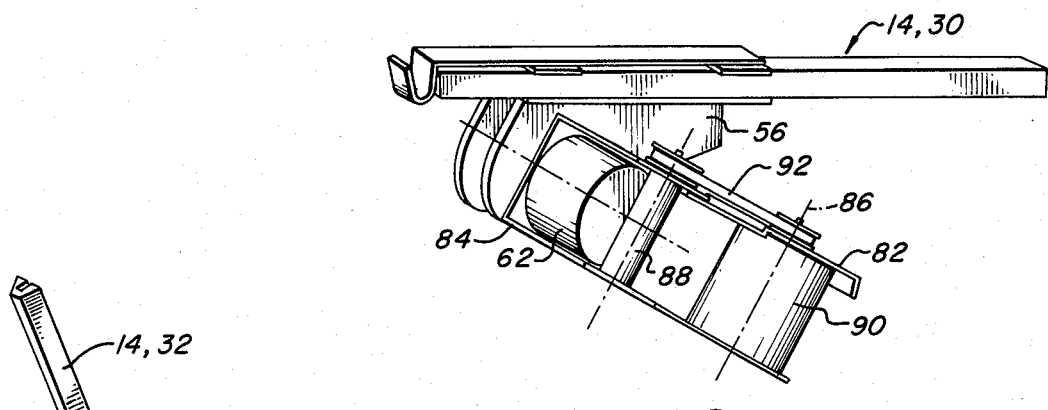
FIG. 11 is a rear perspective view of the gripping and transporting assemblies with the gripping assembly clamped onto a tube in the pick-up position of the conveyor table.
Figure 12:
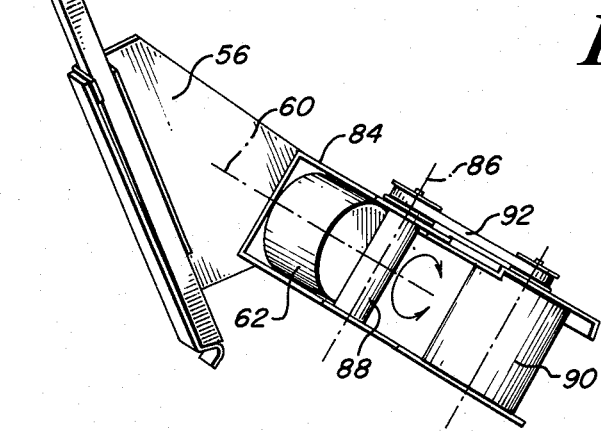
FIG. 12 is a rear perspective view corresponding to FIG. 11 with the gripped tube in the discharge position.
Figure 13:
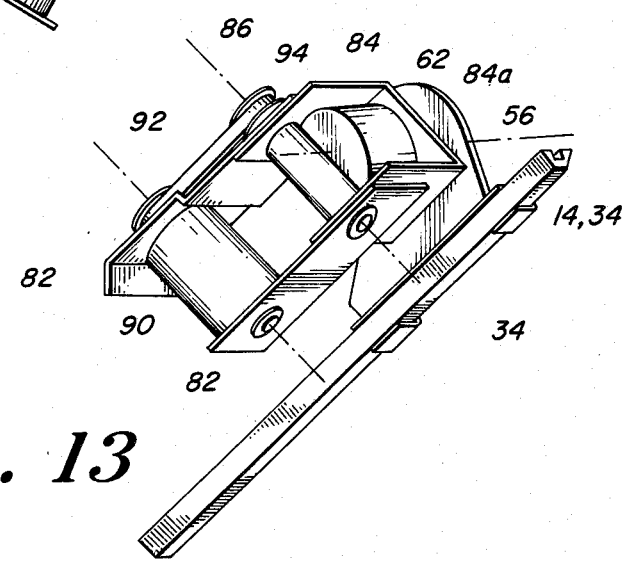
FIG. 13 is a rear perspective view corresponding to FIGS. 11 and 12 but from the opposite side of the apparatus and with the tube in the release position.
Figure 14:
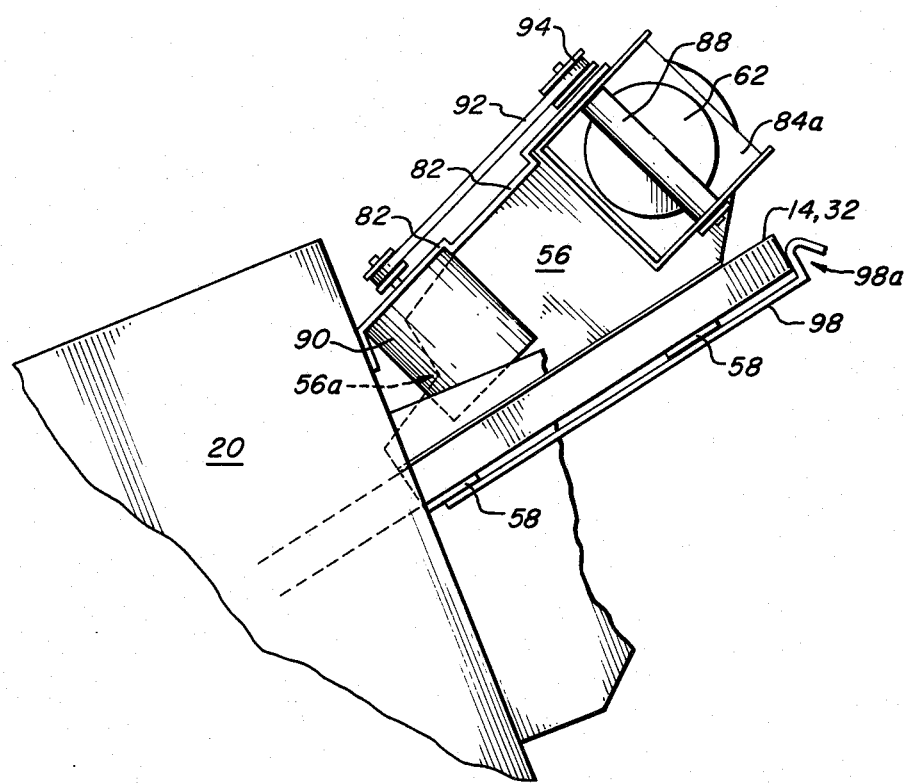
FIG. 14 is a view in side elevation corresponding to FIGS. 6 and 9 but with the gripping assembly in the release position also shown in FIG. 13.

The movement of the gripped tube 14' from the time it is aligned at the pick-up position on the conveyor table with a load of IC's until it is released, is shown in FIGS. 11–13 in a sequence of simplified views of the transport and gripping mechanisms. In FIG. 11 the tube 14' is on the conveyor table in the pick-up position 30 and is gripped. On FIG. 12 the tube has been rotated to the feed position 32. In FIG. 13 the empty tube has been carried to the tube-release position 34 through a rotation of the U-shaped frame 84 through approximately 180°. Note that FIG. 13 is viewed from the opposite side of the mechanism as compared to FIGS. 11 and 12.

When the transport mechanism reaches the tube-release position 34, a conventional limit switch (not shown) such as a microswitch deactivates the motor 90 and activates the solenoid 70. The plate 64 then moves against the force of the spring 68 to its open or release position. This causes the empty tube to slide from the gripping mechanism into a collecting bin (not shown). Once the tube has cleared the gripping mechanism, the motors 62 and 90 are activated simultaneously, in the reverse direction, to carry the gripping mechanism back to its initial position (FIGS. 2, 6 and 11) where it can grip the next leading tube 14' on the conveyor table. The conveyor table drive 39 is then activated to carry the tubes held on the table toward the gripping mechanism. The leading tube moves into the opening between the flanges 58,58 and the centering cams 78,78 mounted on the flange 66.

A significant advantage of this invention is that it can accept a variety of tube sizes. For wide variations in size, the centering cams 78,78 may need to be changed to correspond to the size of the tubes being processed. Another advantage is that it provides automatic loading with a very low degree of operator involvement, a comparatively small amount of hardware, and high reliability. Also, the components of the system are easily accessible for adjustment, repair or replacement. The apparatus and process of the present invention also require no critical alignment of the tubes or special locating fixtures when the tubes are first introduced to the system.

While the invention has been described with respect to its preferred embodiment, it will be understood that various modifications and alterations will occur to those skilled in the art from the foregoing detailed description and the accompanying drawings. For example, while the invention has been described with respect to a particular type of sensing assembly 24, other mechanisms, whether mechanical, electro-mechanical or others, can be used to determine when a tube is positioned and properly oriented at the pick-up location on the conveyor table. Also the conveyor table can utilize only one conveyor belt, but one with a width sufficient to convey and orient the tubes against a reference surface or surfaces that define the pick-up position. The gripping and transport mechanisms can likewise assume configurations and use components other than those described herein provided that the various functions (gripping, blocking, transporting, etc.) are performed as described above. Such modifications and variations are intended to fall within the scope of the appended claims.

What is claimed is:

1. A process for automaticlaly feeding elongated tubes having a first open end and a second closed end and each loaded with plurality of integrated circuits (IC's) held in a line within the tube to the input of a test handler/sorter, comprising the steps of
　　A. providing an accumulating conveyor table that transports the tubes laterally in a first direction;
　　B. inclining said conveyor table from the horizontal about a lower edge that extends generally in said first direction;
　　C. placing said tubes on said conveyor table with said tubes lying on their side and oriented generally transverse to said first direction and with said second closed end adjacent said lower edge;
　　D. transporting said tubes placed on said conveyor table transversely across said table in said first direction to a pick-up position adjacent one end of said conveyor table and oriented substantially perpendicular to said first direction;
　　E. sensing when one of said tubes is located at said pick-up position;
　　F. gripping said tube in said pick-up position in response to said sensing at its open upper end;
　　G. rotating said gripped tube about an axis that is generally parallel to said first direction to transport said open end to a discharge position at said input.

2. The process of claim 1 wherein said tube upper end is open and further comprising the step of controlling the discharge of the IC's from the tubes during said gripping and transporting.

3. The process of claim 2 wherein said controlling comprised the steps of blocking an open end of said tube during said gripping and transporting and unblocking said open end at the conclusion of said transporting when said open end is adjacent said input to allow said IC's to discharge from the tube to said input.

4. The process of claim 2 further comprising the steps of carrying said gripped tube after said discharge to a tube-release position removed from said pick-up and discharge positions and releasing said tube at said tube-release position.

5. The process of claim 1 wherein said inclining is at an angle of 10° to 30° from the horizontal.

6. The process of claim 1 wherein said gripping also includes the step of centering said tube located at said pick-up position simultaneously with said gripping.

7. The process of claim 4 further comprising the step of sensing when said IC's are completely discharged from the tube, generating a control signal indicative of this condition, and initiating said carrying in response to said control signal.

8. The process according to claim 1 wherein said rotating is in a vertical plane from said pick-up position to said discharge position where said tube is inclined with respect to the horizontal to promote a gravity discharge of said IC's to said input.

9. The process according to claim 4 wherein said carrying comprises rotating said gripped tube in a plane inclined with respect to the horizontal from said discharge position to said tube-release position.

10. A system for automatically loading IC's into the input of a high speed test handler/sorter where the IC's are held in an end-to-end line in elongated hollow tubes with a closed end that blocks the discharge of IC's and an open end, comprising A. an accumulating conveyor table that holds one or more of the tubes and transports them laterally in a first direction, said table being inclined from the horizontal at an acute angle about a lower edge;

B. means for sensing when one of the tubes is in a pick-up position located at one end of the conveyor table and oriented substantially transversely to said first direction, said sensing means generating a first control signal when said one tube is in said pick-up position;

C. means for gripping the open end of said tube located in said pick-up position in response to said first control signal; and D. means for rotating said gripped tube from said pick-up position to a discharge position at said input about an axis that is generally parallel to said first direction.

11. The loading system of claim 10 further comprising support and alignment means that extends across said lower edge of said conveyor table in said first direction to hold the closed ends of the tubes on the conveyor table.

12. The loading system of claim 10 further comprising means for controlling the discharge of the IC's and the like from the open end of the tube during said rotating.

13. The loading system of claim 12 wherein said controlling means comprises a resilient member mounted on said gripping means that blocks the open end and cam means to move said resilient member from the open end when it is at said discharge position.

14. The loading system of claim 12 further comprising means for carrying said gripped tube from said discharge position to a tube release position removed from said pick-up and discharge positions.

15. The loading system according to claim 14 further comprising means for sensing when said IC's are completely discharged from said gripped tube and generating a control signal indicative of this condition that activates said carrying means.

16. The loading system of claim 10 wherein said acute angle is in the range of 10° to 30°.

17. The loading system of claim 11 wherein said support and alignment means comprises a stop surface mounted at said lower edge of said conveyor table.

18. The loading system of claim 10 wherein said conveyor table includes at least two conveyor belts that each extend in said first direction and means for translating said belts in unison in response to said first control signal.

19. The loading system according to claim 18 wherein said belts are formed of a material that develops a sufficient friction with the tubes such that slippage can occur between the belts and the tubes if their movement in said first direction is impeded.

20. The loading system of claim 10 wherein said sensing means includes a locater assembly movable between a first position indicative of no tube being in the pick-up position and a second position indicative of a tube present in the pick-up position and having a proper orientation and transducer means for converting the presence of the location assembly in the second position into said first control signal.

21. The loading system according to claim 20 wherein said locater assembly includes a mount, an actuator member pivotally supported in said mount and gravity biased to said first position, a detector member also pivotally mounted in said mount that mates with said tube in said pick-up position if it is properly oriented, and means for lightly coupling said actuator member and said detector member so that they move in unison provided said tube is properly oriented.

22. The loading system according to claim 21 wherein said actuator member is generally L-shaped and has one arm positioned to abut the tube when it approaches said pick-up position and pivot said member to said second position as said tube moves to said pick-up position.

23. The loading system according to claim 22 wherein said tube has a generally U-shaped cross-section and has a longitudinally extending cavity, and wherein said detector member has a probe that projects upwardly and is positioned to enter said longitudinal concavity when it is properly oriented in said pick-up position.

24. The loading system of claim 10 wherein said gripping means includes a support plate, an opposed pair of gripping members mounted on said support plate, at least one of said gripping members being movable with respect to the other between a first release position and a second gripping position, and means for driving said at least one movable gripping member between said first and second positions.

25. The loading system of claim 24 further comprising means for centering said tube when said gripping means is in its second gripping position.

26. The loading system of claim 25 wherein said centering means comprises cam means mounted on one of said gripping members that engages interior side walls of said tube to drive said tube into a preselected centered position as said gripping members move into said second gripping position.

27. The loading system of claim 24 wherein said rotating means includes pivotal mounting means for said support plate and means for rotating said support plate about said pivotal mounting means.

28. The loading system according to claim 14 wherein said carrying means includes a support frame rotatable about an axis generally transverse to the plane of said conveyor table, said support frame mounting said gripping means and rotating means, and means for rotating said support frame.

29. A system for automatically loading IC's into the input of a high speed test handler/sorter where the IC's are held in an end-to-end line in elongated hollow tubes with a closed end that blocks the discharge of IC's and an open end, comprising
   A. an accumulating conveyor table that holds one or more of the tubes and transports them laterally in a first direction, said table being inclined from the horizontal at an acut angle about a lower edge;
   B. means for sensing when one of the tubes is in a pick-up position located at one end of the conveyor table and oriented substantially transversely to said first direction, said sensing means generating a first control signal when one of said tubes is in said pick-up position;
   C. means for gripping the tube in the pick-up position at its upper, open end and rotating said gripped tube about first and second axis transverse to one another while continously gripping said tube during the rotations, said first axis being generally parallel to said first direction wherein said gripping means moves said tube from said pickup position to a a discharge position at said input and said second axis defining the path of movement of said gripped tube from said discharge positions to a tube-release position.

30. The loading system of claim 10 further comprising means for adjusting the position of said lower edge to accommoadate tubes of varying length.

* * * * *